(12) United States Patent
Johnson et al.

(10) Patent No.: US 6,958,642 B2
(45) Date of Patent: Oct. 25, 2005

(54) GROUND DIFFERENCE COMPENSATING SYSTEM

(75) Inventors: Kris W. Johnson, Washington, IL (US); Sivaprasad Akasam, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 0 days.

(21) Appl. No.: 10/739,225

(22) Filed: Dec. 19, 2003

(65) Prior Publication Data

US 2005/0134367 A1 Jun. 23, 2005

(51) Int. Cl.$^7$ .............................................. H03L 5/00
(52) U.S. Cl. ...................................... 327/307; 327/545
(58) Field of Search ............................... 327/307, 362, 327/545

(56) References Cited

U.S. PATENT DOCUMENTS

| | | | | |
|---|---|---|---|---|
| 4,721,957 A | * | 1/1988 | Buttle | 340/870.39 |
| 5,513,218 A | * | 4/1996 | Moller | 375/257 |
| 5,841,308 A | * | 11/1998 | Nagata | 327/307 |
| 5,869,909 A | | 2/1999 | Silverberg et al. | 307/89 |

* cited by examiner

Primary Examiner—Quan Tra
(74) Attorney, Agent, or Firm—Finnegan, Henderson, Farabow, Garrett & Dunner

(57) ABSTRACT

A method of ground level compensation includes measuring a voltage of at least one signal with respect to a primary ground potential and measuring, with respect to the primary ground potential, a voltage level associated with a secondary ground potential. A difference between the voltage level associated with the secondary ground potential and an expected value is calculated. The measured voltage of the at least one signal is adjusted by an amount corresponding to the calculated difference.

18 Claims, 1 Drawing Sheet

GROUND DIFFERENCE COMPENSATING SYSTEM

U.S. GOVERNMENT RIGHTS

This invention was made with government support under the terms of Contract No. DC-FC04-2000AL67017 awarded by the Department of Energy. The government may have certain rights in this invention.

TECHNICAL FIELD

This invention relates generally to ground compensation and, more particularly, to an active ground difference compensation system.

BACKGROUND

Electrical systems operate by providing different potential levels, (e.g., voltage levels) to various points in the system. These differences in potential levels can cause current to flow through loads disposed between the different potential levels. This current may be used to drive various types of electrical devices.

Many electrical systems include at least one zero potential level referred to as a ground level. In certain systems a single point ground may be provided, which serves as a zero volt potential level for the system. That is, any or all other potential levels in the system may be referenced with respect to the single point ground.

Other systems, however, may include multiple ground points. In many applications, it may be desirable to maintain these multiple ground points at the same potential level (e.g., zero volts). Maintaining each of the multiple ground points at a common potential level may help to ensure consistency within the electrical system. For example, maintaining the ground points at a common voltage level could ensure that measurements of various signals associated with the electrical system would be consistent regardless of which ground point was used as a reference point. Further, maintaining the ground points at a common voltage level could help to minimize or prevent undesirable leakage current between the ground points.

Maintaining multiple ground points at a common voltage level can be challenging. Simply connecting the multiple ground points to each other using wire connectors may not provide the desired effect. For example, wires include a certain resistance that depends on factors such as wire thickness, length, and material. For short lengths of wire, the resistance may be negligible. For longer lengths of wire, however, the resistance may be significant. This resistance may cause two ground points connected by the wire to reside at different potential levels when a current is allowed to flow in the wire. The magnitude of the potential difference between the two ground points may depend on the total resistance of the wire and the magnitude of the current flowing in the wire. As the magnitude of the current in the wire increases, the potential difference between the two ground points also will increase.

Electrical systems have been proposed that monitor differences between two potential levels and compensate for these differences. For example, U.S. Pat. No. 5,869,909 ("the '909 patent") describes an active ground compensation system that senses a voltage difference between a neutral reference node and a ground node of a power line communication system. In response to a difference between these nodes, the ground compensation system drives the ground node to reduce the voltage difference between the voltage of the ground node and the voltage of the neutral reference node.

While the ground compensating electronics of the '909 patent may compensate for potential differences between two nodes in an electrical system, the configuration disclosed may be problematic and not suitable for many types of applications. For example, complicated electronics may be required for actively driving the ground node to a potential level equivalent to that of another node. Further, the ground compensating circuitry of the '909 patent is directed toward solving problems associated with electrical power systems for homes and may have limited use in other types of electrical systems.

The present invention is directed to overcoming one or more of the problems or disadvantages existing in the ground compensation methods and apparatus of the prior art.

SUMMARY OF THE INVENTION

One aspect of the present invention includes a method of ground level compensation. The method includes measuring a voltage of at least one signal with respect to a primary ground potential and measuring, with respect to the primary ground potential, a voltage level associated with a secondary ground potential. A difference between the voltage level associated with the secondary ground potential and an expected value is calculated. The measured voltage of the at least one signal is adjusted by an amount corresponding to the calculated difference.

A second aspect of the present invention includes a ground compensating control unit. The control unit has a primary ground point, which has a first voltage potential. At least one data input supplies an input signal to the control unit, and a reference input supplies a second voltage potential, associated with a secondary ground point, to the control unit. The control unit also includes a processor configured to: measure, with respect to the first voltage potential, a first voltage magnitude associated with the input signal; measure, with respect to the first voltage potential, a second voltage magnitude associated with the secondary ground point; calculate a difference between the second voltage magnitude and an expected value; and adjust the measured first voltage magnitude by an amount corresponding to the difference.

DETAILED DESCRIPTION

Figure 1:
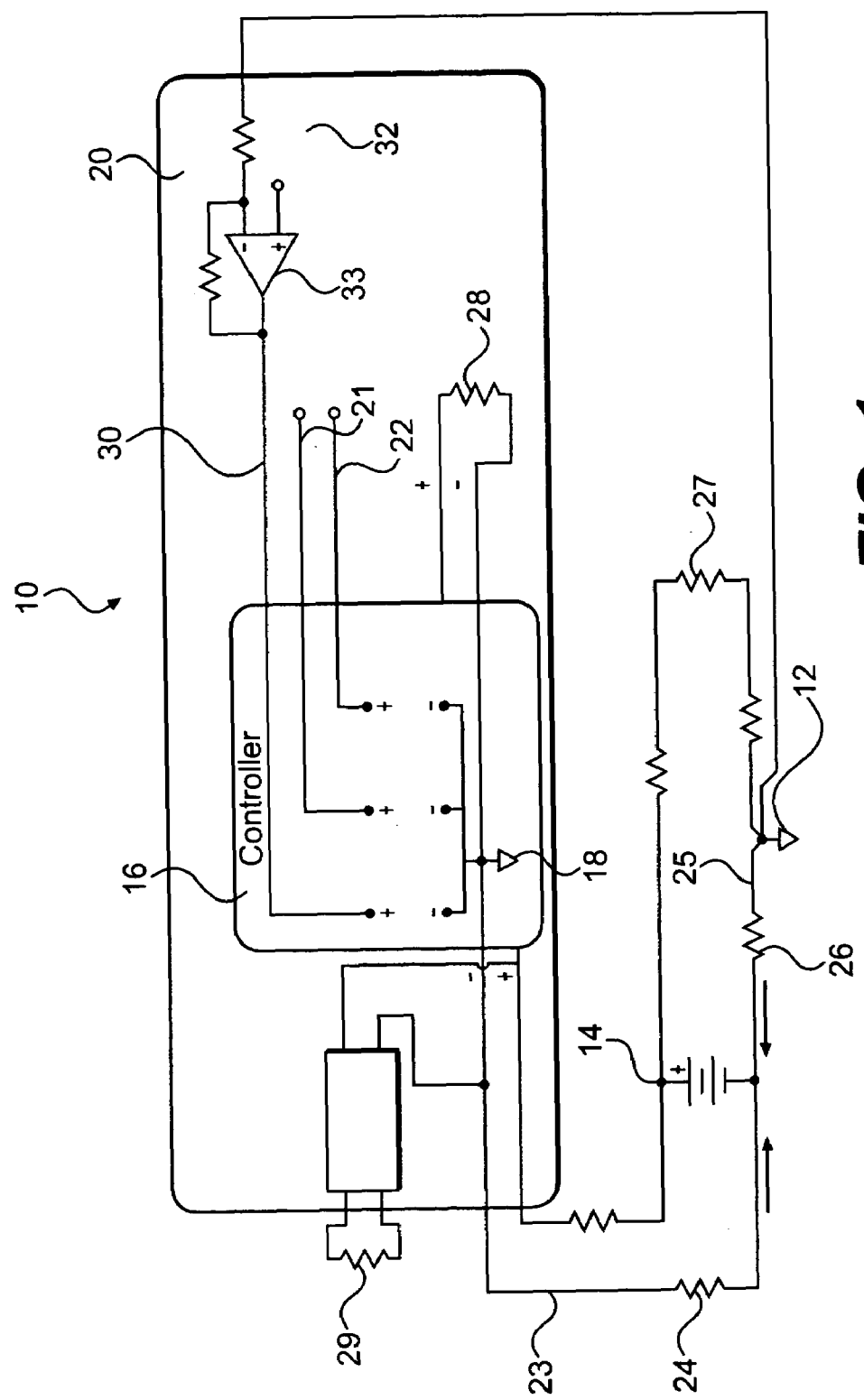
FIG. 1 is a block-level schematic representation of a ground difference compensation system in accordance with an exemplary embodiment of the invention.

A ground difference compensation system 10 for actively compensating for differences between two or more potential levels is shown in FIG. 1. While system 10 may be used with various types of electrical systems, in one exemplary embodiment, system 10 may be included as a component of a vehicular electrical system. System 10 may include, for example, a single point ground 12, a battery 14, a controller 16, and a reference voltage generating circuit 20.

Single point ground 12 may provide a zero voltage potential that serves as a foundation for a significant portion, if not all, of the electrical components of a vehicle. In one embodiment, single point ground 12 may include a conductive element physically attached to a large conductive mass and/or to earth ground. For example, single point ground 12 may include a conductive connection device bolted to the frame of a vehicle. A negative terminal of battery 14 may be connected to single point ground, and many, if not all, of the analog voltage levels produced by various vehicle sensors (e.g., oil pressure, oil temperature, engine speed, coolant temperature, among others) may be referenced to single point ground 12. Battery 14 may provide a 12 volt potential or any other suitable potential level.

Controller 16 may include, for example, an electronic control unit (ECU) of a vehicle. For example, controller 16 may include a dSPACE microAutoBox or other type of ECU. Controller 16 may include a plurality of inputs 21 and 22. It should be noted that controller 16 may include up to N number of inputs determined by factors such as how many signals are to be received by controller 16 and how much physical space is available for inputs on controller 16. Inputs 21 and 22 may be used for receiving analog and/or digital signals from various sources and for supplying those signals to controller 16. For example, inputs 21 and 22 may receive signals from various vehicle sensors. By monitoring the levels of these signals, controller 16 may determine the operating characteristics of, for example, an engine, a coolant system, a lubrication system, a traction system, and other types of vehicle systems. Further, in response to the levels of the signals on inputs 21 and 22, controller 16 may generate output signals for modifying or otherwise controlling the operation of various vehicle systems and their components.

Controller 16 may include a controller ground 18, which may be separate from single point ground 12. For example, controller ground 18 may be located internal to a controller module that houses controller 16. While controller ground 18 may be directly connected to single point ground 12, controller ground 18 may include a potential level different from that of single point ground 12. As shown in FIG. 1, controller ground 18 may be connected to the negative terminal of battery 14 via line 23, which has an associated line resistance 24. Similarly, single point ground 12 may also be connected to the negative terminal of battery 14 via a line 25 having an associated line resistance 26. It should be noted that many connection configurations including single point ground 12, battery 14, and controller ground 18 are possible. For example, a single line may be used to connect single point ground 12 directly to controller ground 18, and connections to the negative terminal of battery 14 may be made separately.

In the exemplary circuit configuration shown in FIG. 1, the potential level of single point ground 12 may differ from the potential level of controller ground 18. For example, in response to a load resistance 27, which may represent one or more current load devices, a current ($I_{LOAD}$) flows in line 25. Similarly, in response to the current load of controller 16, the operation of devices such as relays 28, and a load resistance 29, which may also represent one or more current load devices, a current ($I_C$) flows in line 23. The potential levels of controller ground 18 ($V_{CG}$) and single point ground 12 ($V_{SPG}$) may be represented by the following equations:

$$V_{CG} = V_{BattNeg} + (I_C * R_{24}) \quad (1)$$

$$V_{SPG} = V_{BattNeg} + (I_{LOAD} * R_{26}) \quad (2)$$

where $V_{BattNeg}$ is the potential level of the negative terminal of battery 14, $R_{24}$ is line resistance 24 of line 23, and $R_{26}$ is line resistance 26 of line 25. Combining these equations yields the expression:

$$V_{CG} = V_{SPG} - (I_{LOAD} * R_{26}) + (I_C * R_{24}) \quad (3)$$

Thus, the potential level of controller ground 18 ($V_{CG}$) will differ from that of single point ground 12 ($V_{SPG}$) by an amount dependent on $I_{LOAD}$, $I_C$, $R_{24}$, and $R_{26}$. As will be discussed below, this difference can be significant.

Ground difference compensation system 10 monitors the potential level of controller ground 18 with respect to single point ground 12 and may compensate for differences that may exist between these two voltage levels. Specifically, controller 16 may be configured to receive a reference voltage 30 associated with single point ground 12, to measure the voltage potential of reference voltage 30, and to compare the measured value to an expected value. If a difference exists between reference voltage 30 and the expected value, then controller 16 may recognize that single point ground 12 and controller ground 18 do not share a common potential level. When controller 16 finds a non-zero difference between reference voltage 30 and the expected value, controller 16 may account for this difference when measuring the values of various input signals and when generating various output signals.

Reference voltage 30 associated with single point ground 12 may correspond to the actual potential level of single point ground 12. Alternatively, however, reference voltage 30 may include a potential level offset by a certain amount with respect to the potential level of single point ground 12. For example, where the potential level of single point ground 12 falls within the measurement range of controller 16, the actual potential level of single point ground 12 may be supplied to controller 16 as reference voltage 30. Where the potential level of single point ground 12 falls outside of the measurement range of controller 16, however, an appropriate offset may be added to the potential level of single point ground 12 to provide reference voltage 30.

As illustrated in FIG. 1, ground difference compensation system 10 may include a reference voltage generating circuit 20 configured to add an offset potential to the potential of single point ground 12. In one exemplary embodiment, reference voltage generating circuit 20 includes an op-amp based circuit that generates reference voltage 30 ($V_{REF}$) according to the expression:

$$V_{REF} = (1 + RF/RS) * V_s - (RF/RS) * V_{SPG} \quad (4)$$

where $V_S$ is a supplied voltage 32, $V_{SPG}$ is the voltage potential of single point ground 12, and RF and RS are resistance values associated with resistors of the op-amp based reference voltage generating circuit 20. By definition, $V_{SPG}$ has a potential level of zero volts, and because virtually no current flows to the inputs of an op-amp 33 of reference voltage generating circuit 20, the voltage level supplied to RS will be $V_{SPG}$. The values of RF, RS, and supplied voltage 32 ($V_S$) can be chosen to provide any desired reference voltage 30. With the values shown in FIG. 1 (e.g., $V_S$=2.5 V, RS=200 kΩ, and RF=100 kΩ), reference voltage 30 will have a potential value of 3.75 V. Thus, in this example, reference voltage 30 is offset from the potential level of single point ground by 3.75 V.

Controller 16 can use reference voltage 30 to determine whether a potential difference exists between the potential levels of single point ground 12 and controller ground 18. Specifically, controller 16 may include a processor configured to measure reference voltage 30 with respect to controller ground 18. The measured value for reference voltage 30 may be compared to an expected value for reference voltage 30. Controller 16 may calculate a difference between the measured value of reference voltage 30 and the expected value. The expected value of reference voltage 30 may be a value determined according to the characteristics of the known components of reference voltage generating circuit 20 and may be, for example, stored in a memory of controller 16. The calculated difference value corresponds to the difference in potential levels that exists, at a particular instant, between single point ground 12 and controller ground 18.

Controller 16 may account for the difference in potential levels between single point ground 12 and controller ground 18 by adjusting measured input signals and generated output signals by an amount corresponding to the calculated difference value. For instance, controller 16 may receive an input signal (e.g., a vehicle sensor output) at input 21. Controller 16 measures the magnitude of the input signal with respect to controller ground 18, even though the input signal, itself, may be referenced to single point ground. Thus, if a difference exists between the potential levels of single point ground 12 and controller ground 18, then the magnitude of the input signal as measured by controller 16 will not accurately reflect the magnitude of the input signal with respect to single point ground 12. Controller 16 may, however, correct for a ground difference between single point ground 12 and controller ground 18 by adding the calculated difference value, which may be positive or negative, to the input signal. This adjustment process may proceed at any desired rate. For example, the adjustment process may be initiated as a result of a certain event (e.g., receipt of data on a particular input), or the process may proceed at a certain rate (e.g., a sampling rate of controller 16 or other desired rate). In this manner, controller 16 can account for time-varying ground level differences between single point ground 12 and controller ground 18.

INDUSTRIAL APPLICABILITY

EXAMPLE

The potential difference between controller ground 18 and single point ground 12 may be substantial especially where line resistance values 24 and 26 are significant. In one particular example of a circuit constructed as represented in FIG. 1, a 00 gauge wire of approximately eight feet in length was used for line 25 connecting single point ground 12 to the negative terminal of battery 14. A 00 gauge wire has a resistance of about 0.077 mΩ/ft. Thus, line resistance 26 was about 0.6 mΩ. Line 23, however, was approximately 25 feet in length and was constructed of 16 gauge wire, which has a resistance of about 5 mΩ/ft. Thus, line resistance 24 of line 23 was approximately 125 mΩ.

Substituting these values into equation (3) above, and assuming a current level of 2 A for both IC and ILOAD, provides:

$$VCG = VSPG - (2A * 0.6\ m\Omega) + (2A * 125\ m\Omega),\ or$$

$$VCG = VSPG + 248.8\ mV.$$

Thus, currents of 2 A through lines 23 and 25, which are not uncommon in many vehicular and other applications, would provide a voltage potential offset between controller ground 18 and single point ground 12 of approximately 250 mV. This can lead to substantial errors in circuit operation. For example, a 2.5 V signal (e.g., a vehicle sensor output), as measured with respect to single point ground 12, would appear as 2.25 V as measured with respect to controller ground 18. This variation in measurement values represents a 10% error, which could substantially affect the ability of controller 16 to accurately monitor and control many vehicle functions.

The disclosed ground difference compensation system 10 may be used in any electrical application having two or more ground potentials that reside at different potential levels. System 10 has the ability to account for time-varying differences among the ground potentials to help ensure that measurements of signal levels are consistently made with respect to the same ground potential. Further, because system 10 compensates for differences in ground levels by keeping track of the difference values and applying them to measured values, the electronics included in system 10 may be more simple than prior art systems that attempted to drive a ground potential to a new potential level in response to a perceived difference. In view of the lack of electronics for generating a new potential and applying it to one or more ground levels, system 10 may have a quicker response time than prior art systems.

It will be apparent to those skilled in the art that various modifications and variations can be made in the disclosed ground difference compensation methods and apparatus without departing from the scope of the disclosure. Additionally, other embodiments of the ground difference compensation methods and apparatus will be apparent to those skilled in the art from consideration of the specification. It is intended that the specification and examples be considered as exemplary only, with a true scope of the disclosure being indicated by the following claims and their equivalents.

What is claimed is:

1. A method of ground level compensation, comprising:
    measuring a voltage of at least one signal with respect to a primary ground potential to provide a voltage measurement;
    measuring, with respect to the primary ground potential, a voltage level associated with a secondary ground potential;
    calculating a difference between the voltage level associated with the secondary ground potential and an expected value;
    adjusting the voltage measurement of the at least one signal by an amount corresponding to the difference.

2. The method of claim 1, wherein the voltage level associated with the secondary ground potential is offset from the secondary ground potential by a fixed amount.

3. The method of claim 2, wherein the fixed amount of offset is between 0V and 5V.

4. The method of claim 2, wherein the expected value is equivalent to the fixed amount of offset.

5. The method of claim 1, wherein the at least one signal is an analog input signal to a control processor.

6. The method of claim 1, wherein the primary ground potential is a ground potential of a control processor.

7. The method of claim 1, wherein the secondary ground potential is a single point ground potential for a vehicle.

8. The method of claim 1, wherein the step of adjusting the measured voltage is performed periodically.

9. The method of claim 1, wherein the difference varies over time.

10. A ground compensating system, comprising:
    a control unit;
    a primary ground point for the control unit, the primary ground point having a first voltage potential;
    at least one data input supplying an input signal to the control unit;

a reference input supplying a second voltage potential, associated with a secondary ground point, to the control unit; and a processor configured to:
measure, with respect to the first voltage potential, a first voltage magnitude associated with the input signal to provide a voltage measurement;
measure, with respect to the first voltage potential, a second voltage magnitude associated with the secondary ground point;
calculate a difference between the second voltage magnitude and an expected value; and
adjust the voltage measurement of the first voltage magnitude by an amount corresponding to the difference.

11. The system of claim 10, wherein the control unit includes an electronic control unit for a vehicle, and the at least one data input receives data from at least one sensor on the vehicle.

12. The system of claim 10, wherein the secondary ground point is a single point ground for a vehicle.

13. The system of claim 10, wherein the second voltage potential includes a voltage level of the secondary ground point and an offset voltage.

14. The system of claim 13, wherein the offset voltage is between 0V and 5V.

15. The system of claim 13, wherein the expected value is equivalent to the offset voltage.

16. The system of claim 10, wherein the processor periodically measures at least one of the first voltage magnitude and the second voltage magnitude.

17. A ground compensating control system for a vehicle, comprising:
a control unit;
a control unit ground point having a first voltage potential;
at least one data input supplying an analog signal from a vehicle sensor to the control unit;
a reference input supplying a second voltage potential to the control unit, the second voltage potential being equivalent to a voltage of a single point ground of the vehicle plus a fixed offset voltage; and
a processor configured to:
measure, with respect to the first voltage potential, a first voltage magnitude associated with the analog signal to provide a voltage measurement;
measure, with respect to the first voltage potential, a second voltage magnitude associated with the second voltage potential;
calculate a difference between the second voltage magnitude and an expected value for the second voltage potential; and
adjust the voltage measurement of the first voltage magnitude by an amount corresponding to the difference.

18. The system of claim 17, wherein the expected value is equivalent to the fixed offset voltage.

* * * * *